(12) United States Patent  
Cho

(10) Patent No.: US 9,070,693 B2  
(45) Date of Patent: *Jun. 30, 2015

(54) SEMICONDUCTOR PACKAGE AND MANUFACTURING METHOD THEREOF

(71) Applicant: SAMSUNG ELECTRO-MECHANICS CO., LTD., Suwon-si, Gyeonggi-do (KR)

(72) Inventor: Min Gi Cho, Gyunggi-do (KR)

(73) Assignee: SAMSUNG ELECTRO-MECHANICS CO., LTD., Suwon, Gyunggi-Do (KR)

( * ) Notice: Subject to any disclaimer, the term of this patent is extended or adjusted under 35 U.S.C. 154(b) by 3 days.

This patent is subject to a terminal disclaimer.

(21) Appl. No.: 14/312,110

(22) Filed: Jun. 23, 2014

(65) Prior Publication Data

US 2014/0299976 A1 Oct. 9, 2014

Related U.S. Application Data

(63) Continuation of application No. 13/404,884, filed on Feb. 24, 2012.

(30) Foreign Application Priority Data

Nov. 22, 2011 (KR) ........................ 10-2011-0122238

(51) Int. Cl.
*H01L 23/00* (2006.01)
*H01L 23/31* (2006.01)
(Continued)

(52) U.S. Cl.
CPC ..... *H01L 23/552* (2013.01); *H01L 2224/16225* (2013.01); *H01L 2924/15311* (2013.01);
(Continued)

(58) Field of Classification Search
USPC ........................................................ 257/660
See application file for complete search history.

(56) References Cited

U.S. PATENT DOCUMENTS

| 6,285,559 | B1 | 9/2001 | Fukiharu |
| 2004/0065963 | A1 | 4/2004 | Karnezos |

(Continued)

FOREIGN PATENT DOCUMENTS

| JP | 04-044296 A | 2/1992 |
| JP | 05-315835 A | 11/1993 |

(Continued)

OTHER PUBLICATIONS

Korean Office Action for Aplication No. 10-2011-0122238 dated Apr. 5, 2013.

(Continued)

*Primary Examiner* — Zandra Smith
*Assistant Examiner* — Lawrence Tynes, Jr.
(74) *Attorney, Agent, or Firm* — McDermott Will & Emery LLP

(57) ABSTRACT

There are provided a semiconductor package and a manufacturing method thereof, capable of increasing integration by mounting electronic devices on both surfaces of a substrate. The semiconductor package includes a first substrate having mounting electrodes on both surfaces thereof; a plurality of electronic devices mounted on both surfaces of the first substrate; and a second substrate exposed in cavities and bonded to a bottom surface of the first substrate so as to accommodate the electronic devices mounted on the bottom surface of the first substrate in the cavities.

18 Claims, 9 Drawing Sheets

(51) Int. Cl.
   *H01L 23/538*   (2006.01)
   *H01L 25/16*   (2006.01)
   H01L 23/552   (2006.01)
   H01L 21/56   (2006.01)

(52) U.S. Cl.
   CPC ............. H01L2924/19105 (2013.01); *H01L 2924/19106* (2013.01); *H01L 23/3128* (2013.01); *H01L 21/565* (2013.01); *H01L 23/5385* (2013.01); *H01L 25/16* (2013.01); *H01L 24/45* (2013.01); *H01L 24/85* (2013.01)

(56) References Cited

U.S. PATENT DOCUMENTS

2004/0145039 A1   7/2004   Shim et al.
2005/0280139 A1*   12/2005   Zhao et al. .................... 257/704
2006/0220210 A1*   10/2006   Karnezos et al. ............. 257/686
2011/0186996 A1*   8/2011   Takahashi ..................... 257/737
2013/0127025 A1*   5/2013   Cho ............... 257/660

FOREIGN PATENT DOCUMENTS

| JP | 11-340416 | 12/1999 |
| JP | 2004135192 A | 4/2004 |
| JP | 2006173493 A | 6/2006 |
| JP | 2006-245435 A | 9/2006 |
| KR | 101039846 B1 | 6/2011 |

OTHER PUBLICATIONS

Taiwan Examination Report issued in Taiwan Application No. 101108587 dated May 9, 2014, w/English translation.

* cited by examiner

SEMICONDUCTOR PACKAGE AND MANUFACTURING METHOD THEREOF

CROSS-REFERENCE TO RELATED APPLICATIONS

This application is a continuation of U.S. patent application Ser. No. 13/404,884, filed on Feb. 24, 2012, which claims the priority of Korean Patent Application No. 10-2011-0122238filed on Nov. 22, 2011, in the Korean Intellectual Property Office, the disclosures of which are incorporated herein by reference.

BACKGROUND OF THE INVENTION

1. Field of the Invention

The present invention relates to a semiconductor package and a manufacturing method thereof, and more particularly, to a semiconductor package and a manufacturing method thereof allowing for increased integration through mounting electronic components on both surfaces of a substrate.

2. Description of the Related Art

Demand for portable devices has recently increased in the field of electronic products. Therefore, the miniaturization and lightening of electronic elements mounted in the electronic products has been continuously demanded.

In order to realize the miniaturization and lightening of the electronic elements, techniques such as a system on chip (SOC) technology, implementing a plurality of individual elements on a single chip, a system in package (SIP) technology, integrating a plurality of individual elements in a single package, or the like, as well as technologies for reducing the sizes of individual mounted components are required.

Meanwhile, in order to manufacture a small, multi-functional semiconductor package, a method of mounting electronic components on both surfaces of the substrate has been developed.

However, in the case that electronic components are mounted on both surfaces of the substrate, it may be difficult to form external connection terminals thereon.

That is, since electronic components may be mounted on both surfaces of the substrate, a position at which the external connection terminals are formed is not explicit and thus, a double side mounted semiconductor package having easily formed external connection terminals is required.

SUMMARY OF THE INVENTION

An aspect of the present invention provides a double side mounted semiconductor package and a manufacturing method thereof capable of mounting electronic devices on both surfaces of a substrate.

Another aspect of the present invention also provides a double side mounted semiconductor package and a manufacturing method thereof capable of easily forming external connection terminals.

According to an aspect of the present invention, there is provided a semiconductor package, including: a first substrate having mounting electrodes formed on both surfaces thereof; a plurality of electronic devices mounted on both surfaces of the first substrate; and a second substrate exposed in cavities and bonded to a bottom surface of the first substrate so as to accommodate the electronic devices mounted on the bottom surface of the first substrate in the cavities.

The second substrate may have electrode pads electrically connected to the first substrate and formed on the top surface thereof and have external connection terminals being electrically connected to the outside and formed on the bottom surface thereof.

The semiconductor package may further include a mold part sealing the electronic devices mounted on the top surface of the first substrate.

The semiconductor package may further include a shield layer formed on an outer surface of the mold part to shield an electromagnetic wave.

The second substrate may have a plurality of shielding vias exposed to the outside along a side thereof and the shielding vias may be electrically connected to the shield layer.

The second substrate may have the plurality of shielding vias exposed to the outside along the side thereof.

The semiconductor package may further include an insulating layer interposed between the first substrate and the second substrate.

The first substrate may have a blocking part keeping the insulating layer from being spread across the surfaces of the cavity of the second substrate and formed on the bottom surface thereof.

The blocking part may be formed as a groove or protrusion.

The cavity of the second substrate may be formed as a groove or through hole.

According to another aspect of the present invention, there is provided a method of manufacturing a semiconductor package, including: preparing a first substrate having mounting electrodes formed on both surfaces thereof; mounting at least one electronic device on a top surface of the first substrate; and mounting at least one electronic device and a second substrate on a bottom surface of the first substrate.

The method of manufacturing a semiconductor package may further include forming a mold part on the top surface of the first substrate after the mounting of the electronic devices.

The method of manufacturing a semiconductor package may further include forming a shield layer on an outer surface of the mold part after the forming of the mold part.

The mounting of the electronic device and the second substrate may include electrically connecting a plurality of shielding vias exposed to the outside along a side of the second substrate with the shield layer.

The mounting of the electronic device and the second substrate may include: applying a solder paste to the bottom surface of the second substrate; seating the electronic devices and the second substrate on the solder paste; and fixedly bonding the electronic devices and the second substrate to the bottom surface of the first substrate by curing the solder paste.

The method of manufacturing a semiconductor package may further include forming an insulating layer between the first substrate and the second substrate after the mounting of the electronic device and the second substrate.

The mounting of the second substrate may be performed such that the at least one electronic device is accommodated in cavities formed in the second substrate.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Figure 1:
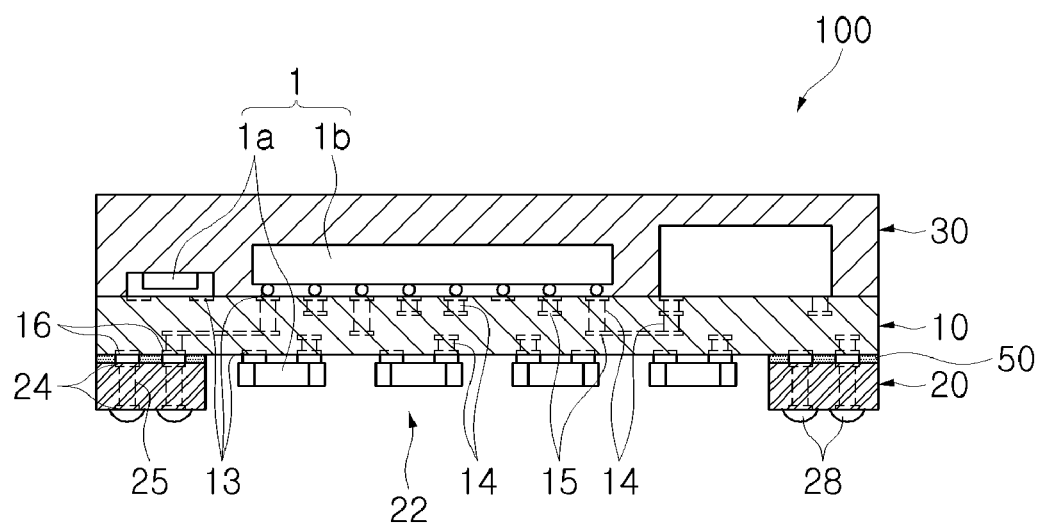
FIG. 1 is a cross-sectional view schematically showing a semiconductor package according to an embodiment of the present invention.

The terms and words used in the present specification and claims should not be interpreted as being limited to typical meanings or dictionary definitions, but should be interpreted as having meanings and concepts relevant to the technical scope of the present invention based on the rule according to which an inventor can appropriately define the concept of the term to describe appropriately the method he or she knows for carrying out the invention. Therefore, the configurations described in the embodiments and drawings of the present invention are merely embodiments but do not represent all of the technical spirit of the present invention. Thus, the present invention should be construed as including all the changes, equivalents, and substitutions included in the spirit and scope of the present invention at the time of filing this application.

Hereinafter, embodiments of the present invention will be described in detail with reference to the accompanying drawings. At this time, it is noted that like reference numerals denote like elements in appreciating the drawings. Moreover, detailed descriptions related to well-known functions or configurations will be ruled out in order not to unnecessarily obscure the subject matter of the present invention. Based on the same reason, it is noted that some components shown in the drawings are exaggerated, omitted or schematically illustrated, and the size of each component does not exactly reflect its real size.

Hereinafter, embodiments of the present invention will be described in detail with reference to the accompanying drawings.

FIG. 1 is a cross-sectional view schematically showing a semiconductor package according to an embodiment of the present invention. In addition, FIG. 2 is a partially cutaway perspective view showing an inside of the semiconductor package shown in FIG. 1, and FIG. 3 is an exploded perspective view of the semiconductor package shown in FIG. 1.

Figure 2:
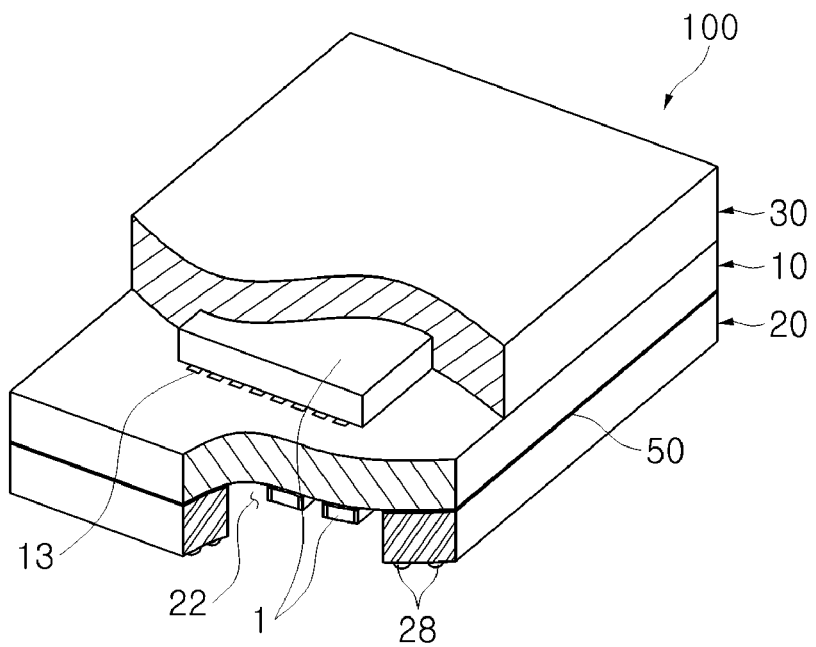
FIG. 2 is a partially cutaway perspective view showing an inside of the semiconductor package shown in FIG. 1.
Figure 3:
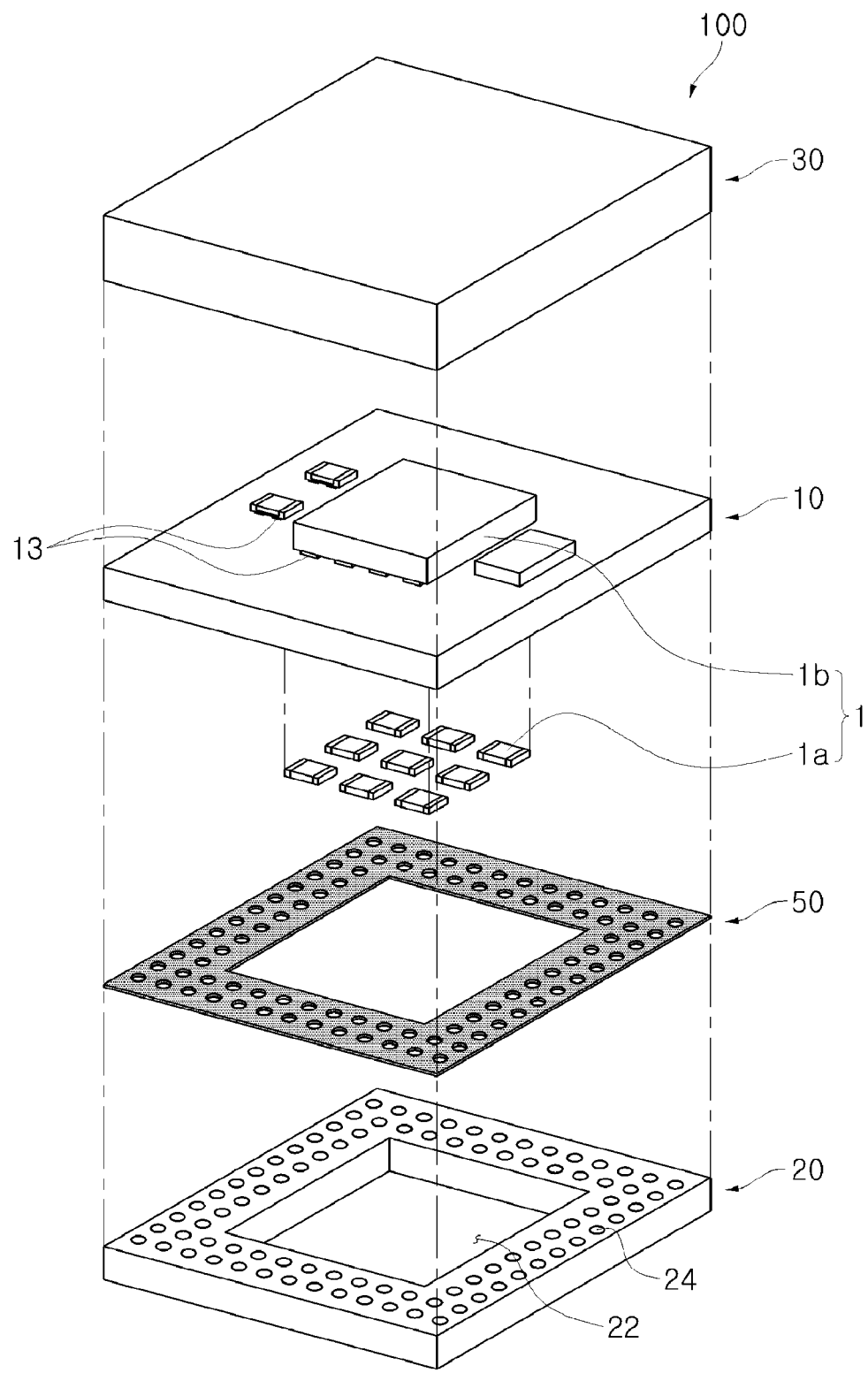
FIG. 3 is an exploded perspective view of the semiconductor package shown in FIG. 1.

Referring to FIGS. 1 to 3, a semiconductor package 100 according to an embodiment of the present invention may be configured to include electronic devices 1, a first substrate 10, a second substrate 20, and a mold part 30.

The electronic devices 1 include various components such as a passive device 1a and an active device 1b. However, any components that may be mounted on a substrate 10 may be used as the electronic device 1.

The electronic device 1 may be mounted both on a top surface and a bottom surface of the first substrate 10 to be described below. FIG. 1 shows, for example, a case in which the active device 1b and the passive device 1a are mounted on the top surface of the first substrate 10 and only the passive device 1a is mounted on the bottom thereof. However, the embodiment of the present invention is not limited thereto. The electronic devices 1 may be disposed on both surfaces of the first substrate 10 in various shapes according to a design of the semiconductor package 100.

At least one electronic device 1 may be mounted on both surfaces of the first substrate 10, respectively. As the first substrate 10, various types of substrates (for example, a ceramic substrate, a printed circuit board, a flexible substrate, or the like) that are well known in the art may be used. In addition, mounting electrodes 13 for mounting the electronic devices 1 or wiring patterns (not shown) electrically connecting between the mounting electrodes 13 may be formed on both surfaces of the first substrate 10.

The first substrate 10 according to the embodiment of the present invention may be a multilayer substrate formed in a plurality of layers and a circuit pattern 15 for forming electrical connection may be formed between each layer.

In addition, the first substrate 1 according to the embodiment of the present invention may include the mounting electrodes 13 formed on the top surface thereof, the circuit pattern 15 formed in the first substrate 10, and conductive vias 14 electrically connecting the mounting electrodes 13 and the circuit patterns 15.

In addition, the first substrate 10 according to the embodiment of the present invention may be provided with a cavity (not shown) embedding the electronic devices 1 inside the first substrate 10.

In addition, the first substrate 10 according to the embodiment of the present invention may have external connection pads 16 on the bottom surface thereof. The external connection pads 16 may be provided to be electrically connected to the second substrate 20 to be described below and may be connected with external connection terminals 28 through the second substrate 20.

Therefore, the external connection pad 16 may be formed at a position opposite to the top surface of the second substrate 20 in the bottom surface of the first substrate 10 when the second substrate 20 is coupled with the first substrate 10 and may be disposed in plural in various shapes as needed.

The second substrate 20 may be disposed on a bottom of the first substrate 10 and may be coupled with the first substrate 10.

Further, the inside of the second substrate 20 according to the embodiment of the present invention may be provided with cavities 22 in a through hole shape. The cavity 22 may be used as a space in which the electronic devices 1 mounted on the bottom surface of the first substrate 10 is accommodated. Therefore, the electronic devices 1 mounted on the bottom surface of the first substrate 10 may be mounted only at a position facing the cavity 22 of the second substrate 20 in the bottom surface of the first substrate 10.

Similar to the first substrate 10, as the second substrate 20, various types of substrates (for example, a ceramic substrate, a printed circuit board, a flexible substrate, or the like) that are well known in the art may be used.

In addition, electrode pads 24 may be formed on both surfaces of the second substrate 20. The electrode pads 24 formed on the top surface of the second substrate 20 may be provided to be electrically connected to the external connection pads 16 of the first substrate 10. In addition, the electrode pad 24 formed on the bottom surface thereof may be provided to be coupled to the external connection terminals 28. Meanwhile, although not shown, both surfaces of the second substrate 20 may be formed with wiring patterns for electrically connecting the electrode pads 24.

The second substrate 20 according to the embodiment of the present invention may be a multilayer substrate formed of a plurality of layers and the circuit pattern (not shown) for forming electrical connection may be formed between each layer.

In addition, the second substrate 20 may include the electrode pads 24 formed on both surfaces, and conductive vias 25 electrically connecting the circuit patterns formed in the second substrate 20.

In addition, the second substrate 20 according to the embodiment of the present invention may be formed to have a thickness thicker than the mounting height of the electronic devices 1 mounted on the bottom surface of the first substrate in order to stably protect the electronic devices 1 accommodated in the cavity 22. However, the embodiment of the present invention is not limited thereto.

The bottom surface of the second substrate 20 is provided with the external connection terminal 28. The external connection terminal 28 may electrically and physically connect the semiconductor package 100 to the main board (not shown) on which the semiconductor package 100 is mounted.

The external connection terminal 28 according to the embodiment of the present invention may be a signal transmission terminal electrically connected to the electronic device 1.

The signal transmission terminal may electrically connect the electronic devices 1 with the main board. Therefore, the signal transmission terminal may be provided in plural corresponding to the number or type of electronic devices 1, or the like.

The external connection terminal 28 may be disposed on the electrode pad 24 formed on the bottom surface of the second substrate 20. The external connection terminal 28 may be formed in a bump form, but is not limited thereto and may be formed in various shapes such as a solder ball, or the like.

The external connection terminals 28 are electrically connected with the electrode pads 24 formed on the top surface of thereof via the vias 25. Therefore, when the second substrate 20 is coupled with the first substrate 10, the first substrate 10 may be electrically connected with the external connection terminals 28 through the second substrate 20.

The mold part 30 may be formed on the top surface of the first substrate 10 and seal the electronic devices 1 mounted on the top surface of the first substrate 10.

The mold part 30 may be filled between the electronic devices 1 mounted on the first substrate 1 to prevent the electrical short between the electronic devices 1. In addition, the mold part 30 may surround the exteriors of the electronic devices 1 and fix the electronic devices 1 on the substrate to safely protect the electronic devices 1 from the outside impact.

The mold part 30 may be formed of insulating materials including a resin material such as epoxy, or the like. In addition, the mold part 30 according to the embodiment of the present invention may be formed by seating the first substrate 10 having the electronic devices 1 mounted on the top surface thereof in a mold (not shown) and injecting a molding resin in the mold. However, the embodiment of the present invention is not limited thereto.

Meanwhile, the semiconductor package 100 according to the embodiment of the present invention may include an insulating layer 50 interposed between the first substrate 10 and the second substrate 20. The insulating layer 50 is formed of insulating materials and may be filled between the first substrate 10 and the second substrate 20 to protect a conductive member (for example, a bump, or the like) electrically connecting the first substrate 10 with the second substrate 20. In addition, the insulating layer may improve adhesion between the first substrate 10 and the second substrate 20 while insulating the first substrate 10 and the second substrate 20 from each other, thereby increasing the reliability.

The insulating layer 50 may be an underfill resin. Therefore, as an example of the material of the insulating layer 50, an epoxy resin may be used, but the embodiment of the present invention is not limited thereto.

In addition, the embodiment of the present invention describes only the case in which the insulating layer 50 is interposed between the first substrate 10 and the second substrate 20, but is not limited thereto. That is, the insulating layer may be configured to be interposed in a gap between the first substrate 10 and the electronic devices 1 mounted on the bottom surface of the first substrate 10. In this case, the insulating layer 50 may be entirely formed on the bottom surface of the first substrate 10.

The semiconductor package 100 according to the embodiment of the present invention configured as described above may have the electronic devices 1 mounted on both surfaces of the first substrate 10. In addition, the external connection terminal 28 may be formed by the second substrate 20 disposed on the bottom surface of the first substrate 10.

Therefore, according to the embodiment of the present invention, the plurality of electronic devices may be mounted on the single substrate (that is, the first substrate), thereby increasing the integration. Further, since the external connection terminal 28 of the first substrate 10 on which the electronic devices 1 are mounted are formed by the second substrate 20 that is a separate substrate, the external connection terminal 28 may be easily formed.

Next, the method of manufacturing a semiconductor package according to the embodiment of the present invention will be described.

FIGS. 4A to 4F are cross-sectional views for describing a method of manufacturing a semiconductor package according to the embodiment of the present invention.

Figure 4A:
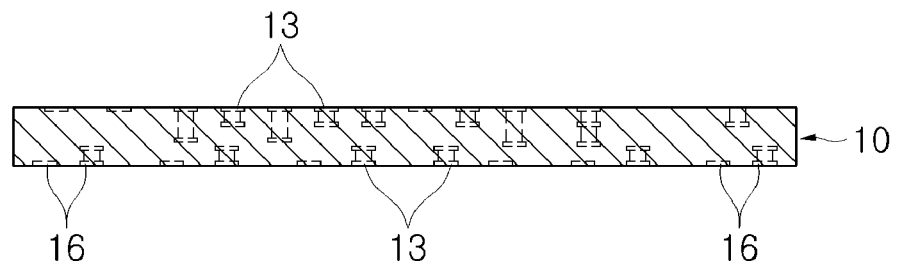
FIGS. 4A to 4F are cross-sectional views for describing a method of manufacturing a semiconductor package according to the embodiment of the present invention.

First, as shown in FIG. 4A, the first substrate 10 may be prepared. As described above, the first substrate 10 may be a multilayer substrate and may be provided with the double side mounted electrodes 13. In addition, the external connection pads 16 may be formed on the bottom surface of the first substrate 10.

Figure 4B:
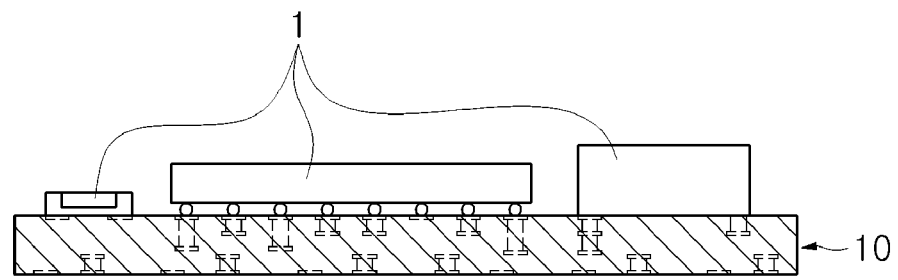

Next, as shown in FIG. 4B, the electronic devices 1 may be mounted on one surface, that is, the top surface of the first substrate 10. The mounting may be performed by printing the solder paste on the mounting electrode 13 formed on one surface of the first substrate 10 in a screen printing manner, or the like, seating the electronic devices 1 thereon, and curing the solder paste by applying heat thereto.

Figure 4C:
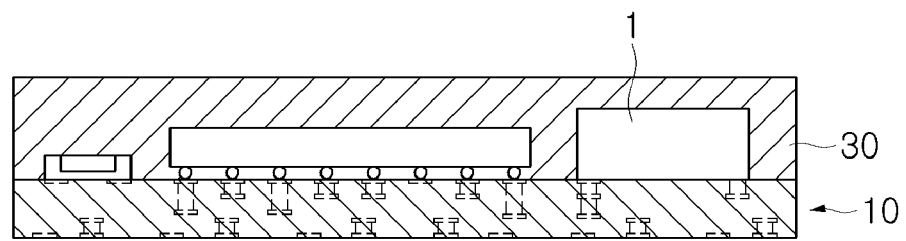

Next, as shown in FIG. 4C, the mold part 30 may be formed on one surface of the first substrate 10. As described above, the forming may be performed by disposing the first substrate 10 mounted with the electronic device 1 in the mold, and then, injecting the molding resin into the mold. As the mold part 30 is formed, the electronic devices 1 mounted on one surface, that is, the top surface of the first substrate 10 may be protected from the outside by the mold part 30.

Figure 4D:
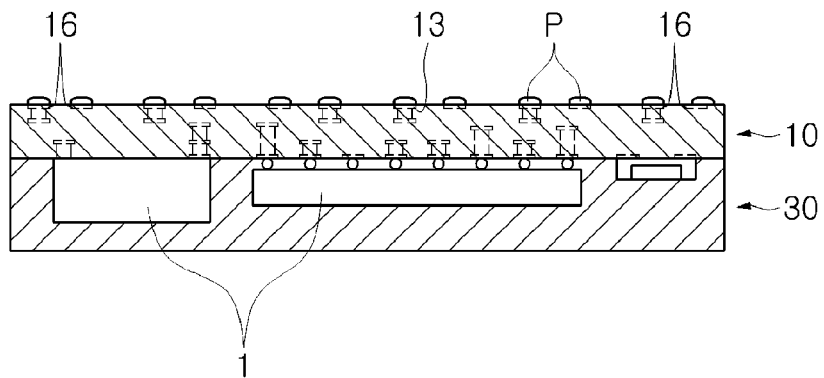

Then, as shown in FIG. 4D, the printing of the solder paste P may be performed on the bottom surface of the first substrate 10 on which the mold part 30 has been formed. In this case, the solder paste P may be printed both on the mounting electrode 13 and the external connection pad 16.

Figure 4E:
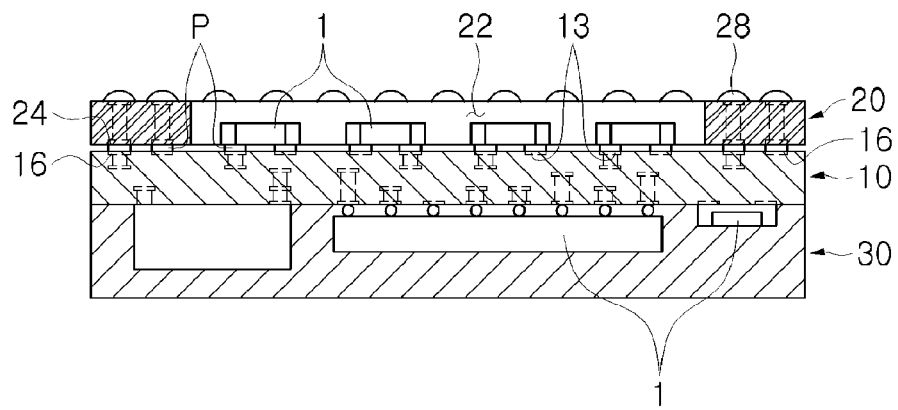

Next, as shown in FIG. 4E, the mounting of the electronic devices 1 and the second substrate 20 may be performed on the bottom surface of the first substrate 10 on which the solder paste P has been printed.

Here, in the mounting procedure, the electronic devices 1 may be first mounted on the mounting electrode 13 and the second substrate 20 may be seated on the external connection pad 16. The mounting may be performed in a sequence of first seating the electronic devices 1 and then seating the second substrate 20, but the embodiment of the present invention is not limited thereto. The mounting may be performed through various manners such as first seating the second substrate 20, simultaneously seating the second substrate 20 and the electronic devices 1, or the like.

As described above, when the electronic devices device 1 and the second substrate 20 are seated on the bottom surface of the first substrate 10, curing the solder paste P may be performed by applying heat to the solder paste P. Through the process, the electronic devices 1 and the second substrate 20 seated on the bottom surface of the first substrate 10 may be firmly bonded to the first substrate 10 so as to be electrically and physically connected to the first substrate 10.

Figure 4F:
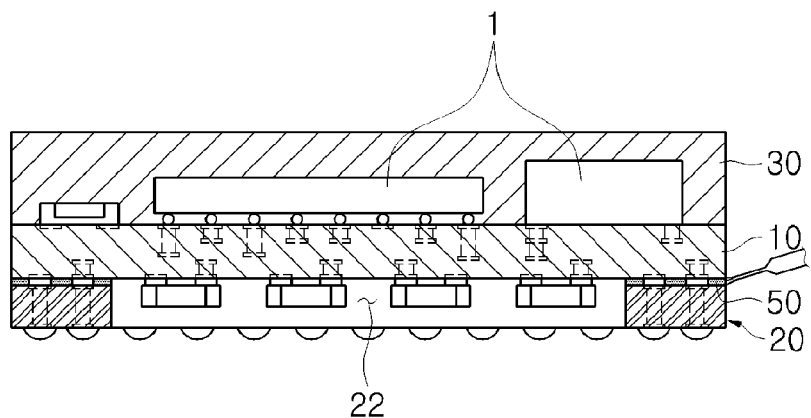

Next, as shown in FIG. 4F, forming the insulating layer 50 between the first substrate 10 and the second substrate 20 may be performed. The forming may be performed by injecting a liquid insulating material such as epoxy resin, or the like, into a gap formed between the first substrate 10 and the second substrate 20.

That is, the insulating layer 50 may be formed by filling a gap formed between the first substrate 10 and the second substrate 20 with the insulating material and curing the insulating material. The first substrate 10 and the second substrate 20 may be firmly bonded with each other while securing the insulation between the first substrate 10 and the second substrate 20.

In the semiconductor package 100 according to the embodiment of the present invention manufactured through the above-mentioned processes, instead of mounting the electronic devices 1 after the first substrate 10 is first bonded to the second substrate 20, the second substrate 20 and the electronic devices 1 (in particular, electronic devices mounted on the bottom surface of the first substrate) may be mounted together. That is, after the electronic devices 1 and the second substrate 2 are seated together with each other on the bottom surface of the first substrate 10, both of the electronic devices 1 and the second substrate 2 may be fixedly bonded through the curing.

Unlike the manufacturing process according to the embodiment of the present invention, when the first substrate 10 is first bonded to the second substrate 20 and then the electronic devices 1 are mounted on the bottom surface of the first substrate 10 through the cavity 22 of the second substrate 20, the printing of the solder paste, the seating of the substrate, and the curing of the solder paste are performed for bonding the first substrate 10 with the second substrate 20. Thereafter, the same processes needs to repeatedly be performed for mounting the electronic devices 1 on the first substrate 10.

However, according to the manufacturing method of the embodiment of the present invention, the printing of the solder paste, the seating of the electronic devices 1, and the curing of the solder paste may be performed only once, thereby mounting the electronic devices 1 and the second substrate 20 on the bottom surface of the first substrate 10.

That is, according to the embodiment of the present invention, the electronic devices 1 and the second substrate 20 may be together disposed on the bottom of the first substrate 10 and fixedly bonded to one another, thereby reducing the manufacturing process and facilitating the manufacturing as compared to the method of separately bonding the electronic devices 1 and the second substrate 20 with the first substrate 10.

Meanwhile, the semiconductor package and the method of manufacturing the same according to the embodiment of the present invention described above are not limited to the above-mentioned embodiments but may be variously applied.

Figure 5A:
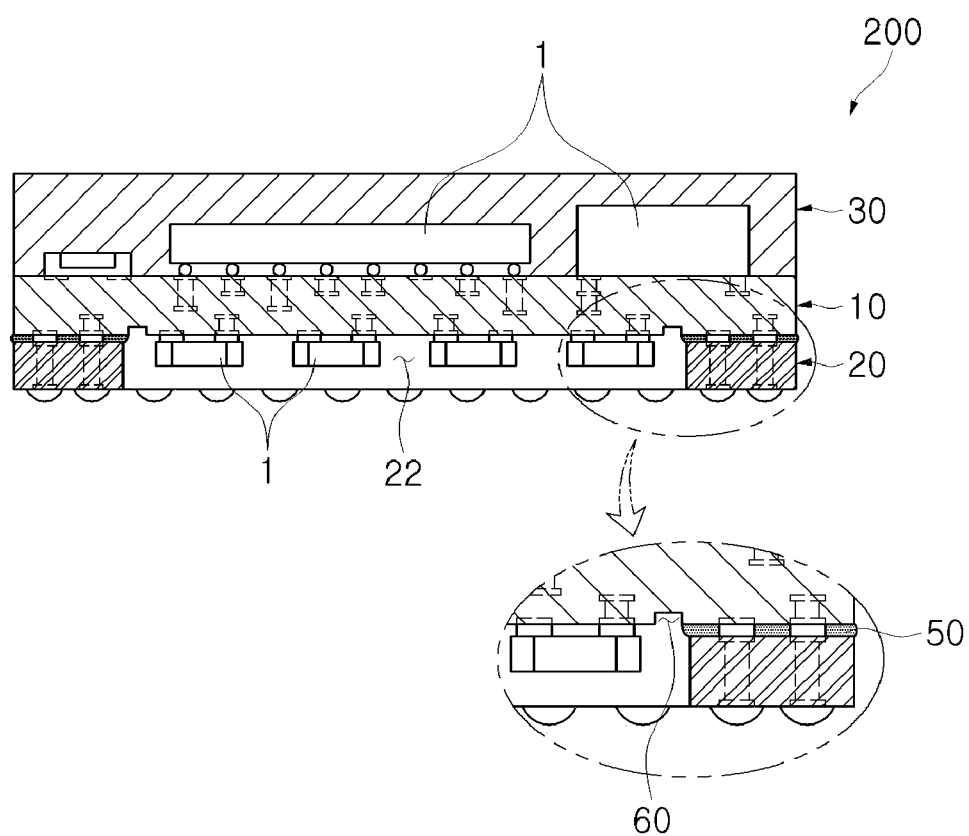
FIGS. 5A and 5B are cross-sectional views schematically showing a semiconductor package according to another embodiment of the present invention.
Figure 5B:
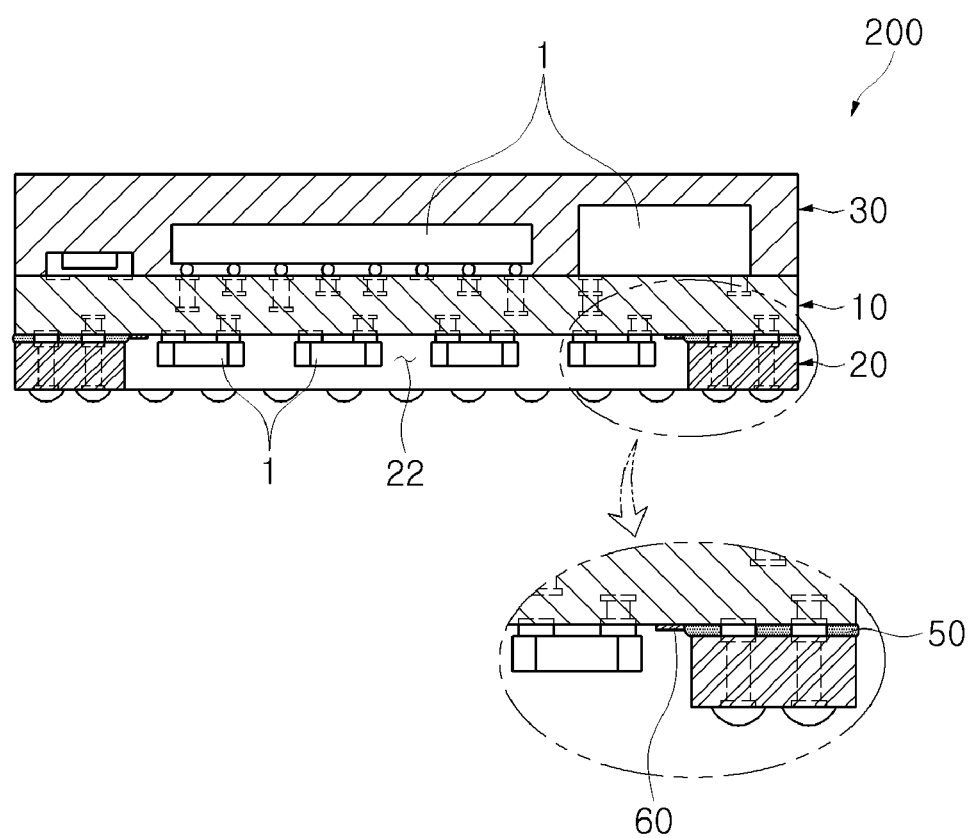

FIGS. 5A and 5B are cross-sectional views schematically showing a semiconductor package according to another embodiment of the present invention.

A semiconductor package 200 according to the embodiment of the present invention may be configured to have a similar structure to the semiconductor package (100 of FIG. 1) according to the embodiment of the present invention as described above and has a difference in a configuration in which a blocking part 60 is formed on the bottom surface of the first substrate 10. Therefore, the detailed description of the same components is omitted and the blocking part 60 will mainly be described in detail. In addition, the same components as the above-mentioned embodiments will be described using the same reference numerals.

Referring to FIG. 5A, the semiconductor package 200 according to the embodiment of the present invention may have the blocking part 60 formed in the bottom surface of the first substrate 10.

The blocking part 60 may be provided in a case in which the insulating layer 50 is formed only in between the first substrate 10 and the second substrate 20.

That is, when forming the insulating layer 50 (see FIG. 4F), the blocking part 60 may be provided to keep the insulating materials injected between the first substrate 10 and the second substrate 20 from being spread across the surfaces of the cavity of the second substrate.

To this end, the blocking part 60 according to the embodiment of the present invention may be formed in a continuous ring shape based on the cavity (22) shape formed in the second substrate 20. In more detail, the blocking part according to the embodiment of the present invention may be formed in the bottom surface of the first substrate 10 in a ring-shaped groove depressed by a predetermined depth.

As such, when the blocking part 60 is formed to have a groove shape, the injected liquid insulating material may not easily spread to the inside of the blocking part 60 due to a surface tension generated at a portion thereof contacting the blocking part 60.

However, a configuration of the blocking part 60 according to the embodiment of the present invention is not limited thereto. That is, as shown in FIG. 5B, the blocking part 60 may also be formed to have a protrusion shape protruded by a predetermined length.

In this case, the blocking part 60 may have a ring-shaped protrusion separately formed on the first substrate 10. The blocking part 60 according to the embodiment of the present invention may be formed through silk printing (or screen printing), but the embodiment of the present invention is not limited thereto. Therefore, the blocking part 60 may be formed by various methods, such as attaching an adhesive tape, mounting the electronic devices in a protrusion shape, or the like. In addition, the blocking part may be formed using wiring patterns (or dummy patterns).

The blocking part 60 may be previously formed during the manufacturing process of the first substrate 10. However, the embodiment of the present invention is not limited thereto, and therefore, the blocking part 60 may be formed by being mounted therefor (the case of the protrusion shape) together with the electronic devices 1 mounted thereon.

Figure 6A:
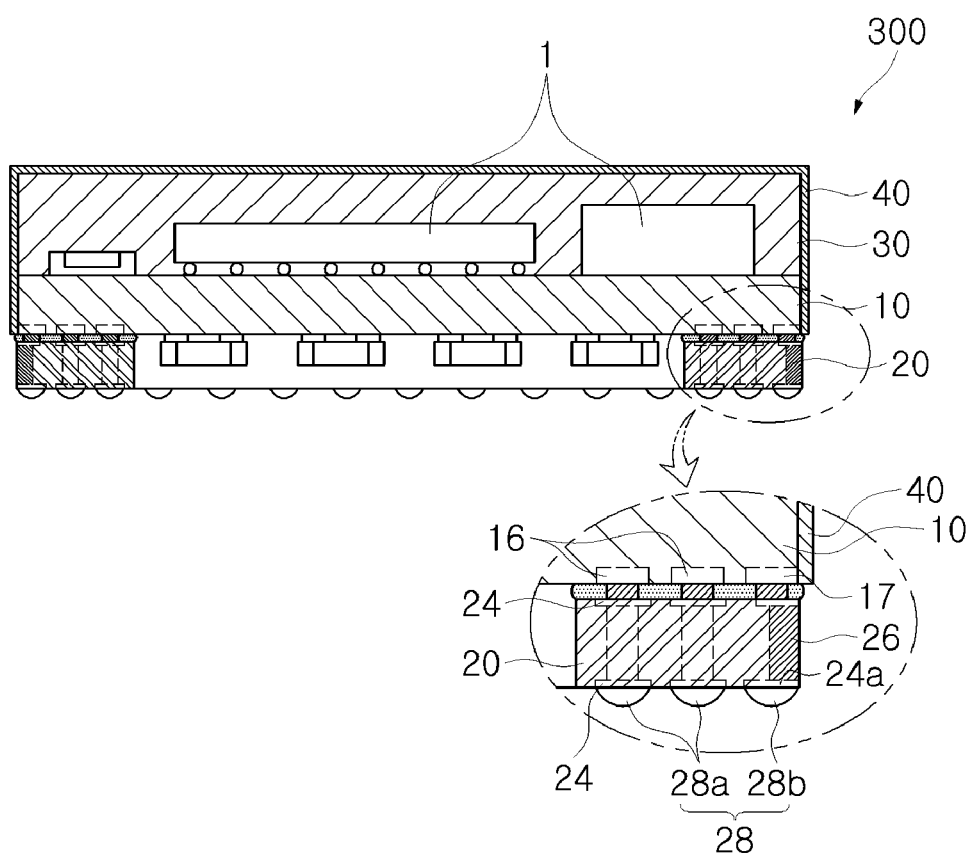
FIGS. 6A and 6B are cross-sectional views schematically showing a semiconductor package according to another embodiment of the present invention.
Figure 6B:
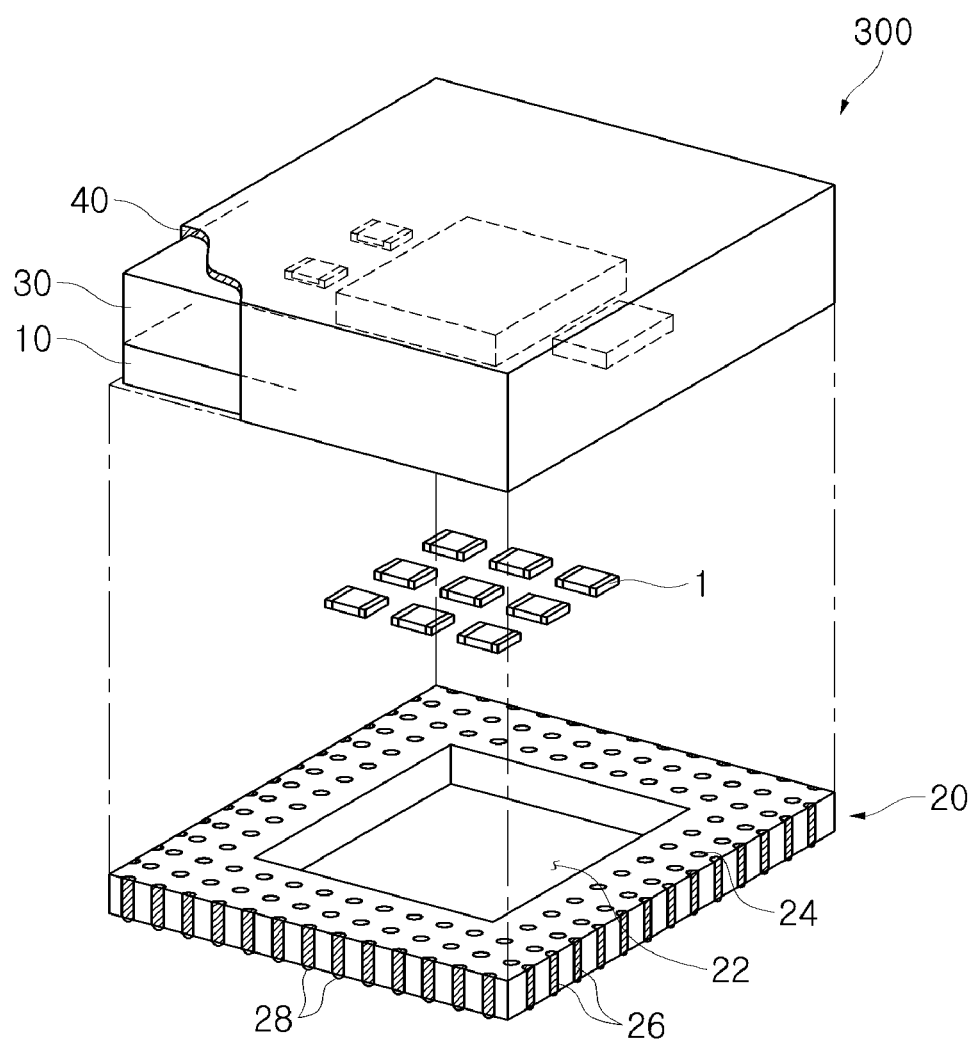

FIGS. 6A and 6B are cross-sectional views schematically showing a semiconductor package according to another embodiment of the present invention.

Referring to FIGS. 6A and 6B, a semiconductor package 300 according to the embodiment of the present invention may be configured similar to that of the semiconductor package (100 of FIG. 1) according to the embodiment of the present invention as described above. The semiconductor package 300 and the semiconductor 100 have difference in only the configuration in which a shield layer 40 is formed on the outer surface of the mold part 30 and the shielding via 26 is formed in the second substrate 20. Therefore, the detailed description of the same components is omitted and the blocking part 40 and the shielding via 26 will mainly be described in detail. In addition, the same components as the above-mentioned embodiments will be described using the same reference numerals.

The semiconductor package 300 according to the embodiment of the present invention may include the shield layer 40 and the shielding via 26.

The shield layer 40 according to the embodiment of the present invention may be formed on the entire outer surface of the mold part 30 and may be formed to extend to the side of the first substrate 10. However, the embodiment of the present invention is not limited thereto and may be formed only on the outer surface of the mold part 30.

Further, although not shown, the shield layer 40 may be formed in various shapes as needed, such as further forming the protective layer for protecting the shield layer on the outer surface of the shield layer 40.

In addition, the shield layer 40 may be configured to be electrically connected to the ground electrode 17 formed on the bottom surface of the first substrate 10.

Meanwhile, FIG. 6 shows, for example, the case in which the shield layer 40 is formed through the side of the first substrate 10 so as to be electrically connected to the ground electrode 17. However, the embodiment of the present invention is not limited thereto and may be variously applied to, for example, the configuration in which the shield layer 40 is formed only on the outer surface of the mold part 30 and the shield layer 40 is connected to the ground electrode 17 through the wiring pattern of the first substrate 10.

The shield layer 40 according to the embodiment of the present invention may be formed of various materials having conductivity. For example, the shield layer 40 may be formed by applying the resin material including conductive powders to the outer surface of the mold part 30 or attaching a separate metal thin film to the outer surface of the mold part 30.

In addition, the metal thin film may be formed through various methods such as sputtering, vapor deposition, spray coating, screen printing, electroplating, electroless plating, or the like.

The plurality of the shielding vias 26 may be formed along a circumference of the second substrate 20. In addition, the shielding vias 26 may be disposed on the side of the second substrate 20 according to the shape of the second substrate 20.

The shielding vias 26 may be electrically connected to the shield layer 40 of the first substrate 10. In addition, the shielding vias 26 may be electrically connected with each other.

The shielding vias 26 may generally be in the same form as the conductive vias 25 and may be formed by the process of forming the conductive vias 25.

Meanwhile, the embodiment of the present invention describes, for example, the case in which the shielding vias 26 are formed in a form in which they are exposed to the side of the second substrate 20. This may result from forming the shielding vias 26 and then cutting the second substrate 20.

However, the shielding vias 26 according to the embodiment of the present invention are not limited thereto, and may be formed in various forms as needed, such as a form in which the shielding vias are entirely embedded in the substrate.

In addition, the plurality of external connection terminals 28 according to the embodiment of the present invention may be disposed on the bottom surface of the second substrate 20 and may electrically and physically connect the semiconductor package 300 to the main board (not shown) on which the semiconductor package 300 is mounted.

The external connection terminal 28 may include a signal transmission terminal 28a and a shielding terminal 28b.

The signal transmission terminal 28a may electrically connect the electronic devices 1 to the main board. Therefore, the signal transmission terminals 28a may be formed in plural to correspond to the number or type of electronic devices 1 and may be attached to the electrode pad 24. In addition, the signal transmission terminal 28a may be electrically isolated from the shield layer 40 or the shielding vias 26.

The shielding terminal 28b may be attached to the ground pad 24a formed to correspond to the position in which the shielding vias 26 are formed, in the bottom surface of the second substrate 20.

The shielding terminal 28b may be electrically connected to the main board (not shown) on which the semiconductor package 300 according to the embodiment of the present invention is mounted. In this case, the shielding terminal 28b may be connected to the ground electrode (not shown) of the main board.

The semiconductor package 300 according to the embodiment of the present invention configured as described above may include the shield layer 40, the shielding vias 26, and the shielding terminal 28b to thus form a shielding shield.

The shielding shield according to the embodiment of the present invention may be formed to surround the mold part 30 and the exterior of the first and second substrates 10 and 20. Therefore, the shielding shield may shield an electromagnetic wave for all the electronic devices 1 mounted on the top surface of the first substrate 10 and the electronic devices 1 mounted on the bottom surface thereof.

That is, since all of the electronic devices 1 are disposed to be accommodated in the inside of the shielding shield, the shielding shield may shield the unnecessary electromagnetic wave introduced from the outside of the semiconductor package 300 and prevent the electromagnetic wave generated from the electronic devices 1 from being radiated to the outside.

The method of manufacturing the semiconductor package 300 according to the embodiment of the present invention may be performed as follows.

The method of manufacturing the semiconductor package 300 according to the embodiment of the present invention may be performed similar to the method of manufacturing the semiconductor package (100 of FIG. 1) according to the above-mentioned embodiments. The method of manufacturing the semiconductor package 300 according to the embodiment of the present invention may be different from the above-mentioned embodiments with regard to the method of manufacturing the semiconductor package (100 of FIG. 1), in that forming the mold part 30 and then forming the shield layer 40 are added.

That is, the method of manufacturing the semiconductor package 300 according to the embodiment of the present invention may further include forming the shield layer 40 on the outer surface of the mold part 30 and the side of the substrate after the mold part 30 is formed as shown in FIG. 4C.

Further, when the shield layer 40 is formed, the semiconductor package 100 according to the embodiment of the present invention may be completed by equally performing the printing of the solder paste show in FIG. 4D and the following processes.

Figure 7:
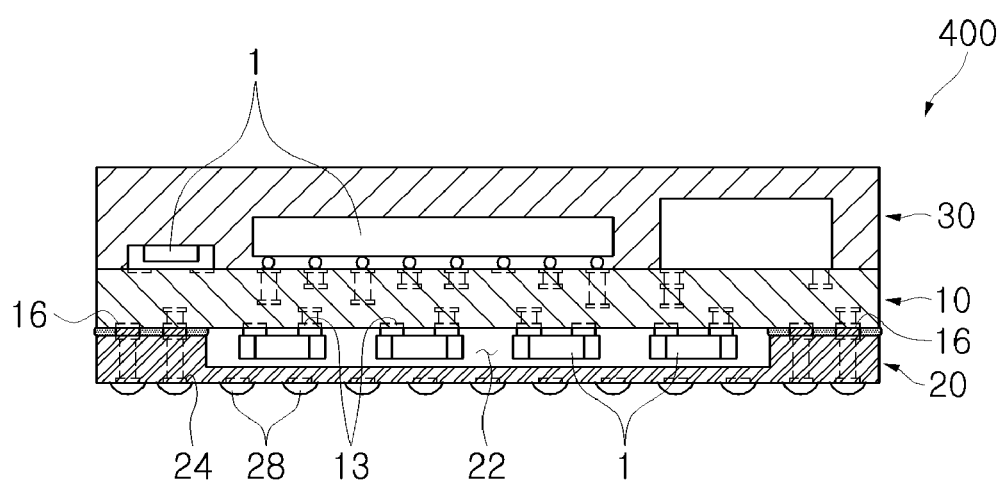
FIG. 7 is a cross-sectional view schematically showing a semiconductor package according to another embodiment of the present invention.

FIG. 7 is a cross-sectional view schematically showing a semiconductor package according to another embodiment of the present invention.

In a semiconductor package 400 according to the embodiment of the present invention, the cavity 22 of the second substrate 20 may be formed as a groove, rather than a through hole form.

As such, when the cavity 22 is formed to have the groove form, the electrode pad 24 or the wiring pattern may be formed on the entire bottom surface of the second substrate 20. Therefore, the external connection terminal 28 may be relatively easily disposed and the design and the utilization thereof may be easy.

In addition, since the electronic devices 1 mounted on the bottom surface of the first substrate 10 are not exposed to the outside, the electronic devices may be easily protected.

As set forth above, with the semiconductor package according to the embodiment of the present invention, the electronic devices may be mounted on both surfaces of the first substrate. Further, the external connection terminals may be formed by the second substrate disposed on the bottom surface of the first substrate.

Therefore, according to the embodiment of the present invention, the plurality of electronic devices may be mounted on the single substrate (that is, the first substrate), thereby increasing the integrity. In addition, according to the embodiment of the present invention, the external connection terminals of the first substrate on which the electronic devices have been mounted may be formed using the second substrate that is a separate substrate, thereby easily forming the external connection terminals of the double side mounted semiconductor package.

In addition, in the semiconductor package according to the embodiment of the present invention, instead of mounting the electronic devices after the first substrate is first bonded to the second substrate; the second substrate and the electronic devices may be mounted on the first substrate. That is, according to the embodiment of the present invention, the electronic devices and the second substrate may be together seated on the bottom surface of the first substrate, to then fixedly bond therebetween through the curing process.

As a result, in the method of manufacturing a semiconductor package according to the embodiment of the present invention, the electronic devices and the second substrate may be mounted on the bottom surface of the first substrate by once performing the process of printing the solder paste, the process of seating the electronic devices, and the process of curing the solder paste only once.

That is, according to the embodiment of the present invention, the electronic devices and the second substrate may be disposed on the bottom surface of the first substrate to thus fixedly bond to one another, thereby relatively more reducing the manufacturing process and relatively facilitating the manufacturing as compared to the method of separately bonding the electronic devices and the second substrate with the first substrate.

The semiconductor package according to the embodiments of the present invention as described above is not limited to the above-mentioned embodiments but may be variously applied.

For example, the above-mentioned embodiments describe, for example, the case in which the mold part is not formed on the bottom surface of the first substrate. However, the mold part may also be formed on the bottom surface of the first substrate, that is, in the cavity of the second substrate.

In addition, the case of the above-mentioned embodiments of the present invention provides, for example, the semiconductor package including the mold part and the insulating layer, but the embodiment of the present invention is not limited thereto and the mold part, the insulating layer, or the like, may be omitted as needed.

In addition, the above-mentioned embodiments of the present invention describe, for example, the case in which the second substrate is formed in the multilayer substrate. However, the embodiments of the present invention are not limited thereto. All the substrates in which the electrode pads formed on the top surface thereof are electrically connected to the electrode pads formed on the bottom surface thereof may be variously applied.

While the present invention has been shown and described in connection with the embodiments, it will be apparent to those skilled in the art that modifications and variations can be made without departing from the spirit and scope of the invention as defined by the appended claims.

What is claimed is:

1. A semiconductor package, comprising:
a first substrate having mounting electrodes fowled on both surfaces thereof;
a plurality of electronic devices mounted on both surfaces of the first substrate;
a second substrate bonded to a bottom surface of the first substrate; and
an insulating layer interposed between the first substrate and the second substrate,
wherein the bottom surface of the first substrate is divided into an insulating region in which the insulating layer is disposed and a mounting region in which the electronic devices are mounted, and
a blocking part is disposed between the insulating region and the mounting region to block a movement of the insulating layer.

2. The semiconductor package of claim 1, wherein the second substrate has electrode pads electrically connected to the first substrate and formed on the top surface thereof and has external connection terminals for being electrically connected to the outside and formed on the bottom surface thereof.

3. The semiconductor package of claim 1, further comprising a mold part sealing the electronic devices mounted on the top surface of the first substrate.

4. The semiconductor package of claim 3, further comprising a shield layer formed on an outer surface of the mold part to shield an electromagnetic wave.

5. The semiconductor package of claim 4, wherein the second substrate has a plurality of shielding vias exposed to the outside along a side thereof and the shielding vias are electrically connected to the shield layer.

6. The semiconductor package of claim 1, wherein the second substrate has the plurality of shielding vias exposed to the outside along the side thereof.

7. The semiconductor package of claim 1, wherein the blocking part is formed as a groove or protrusion.

8. The semiconductor package of claim 1, wherein the second substrate is disclose a hollow place accommodating the electronic devices mounted on the bottom surface of the first substrate.

9. The semiconductor package of claim 8, wherein the hollow place of the second substrate is formed as a groove or through hole.

10. The semiconductor package of claim 1, further comprising a mold part sealing the electronic devices mounted on the top surface of the first substrate.

11. The semiconductor package of claim 10, further comprising a shield layer formed on an outer surface of the mold part to shield an electromagnetic wave.

12. The semiconductor package of claim 11, wherein the second substrate has a plurality of shielding vias exposed to the outside along a side thereof and the shielding vias are electrically connected to the shield layer.

13. The semiconductor package of claim 11, wherein the second substrate has the plurality of shielding vias exposed to the outside along the side thereof.

14. The semiconductor package of claim 11, wherein the blocking part is formed as a groove or protrusion.

15. The semiconductor package of claim 11, wherein the second substrate is disclose a hollow place accommodating the electronic devices mounted on the bottom surface of the first substrate.

16. The semiconductor package of claim 15, wherein the hollow place of the second substrate is formed as a groove or through hole.

17. A semiconductor package, comprising:

a first substrate having mounting electrodes formed on both surfaces thereof;

a plurality of electronic devices mounted on both surfaces of the first substrate;

a second substrate bonded to a bottom surface of the first substrate; and an insulating layer interposed between the first substrate and the second substrate, wherein the bottom surface of the first substrate has a blocking part keeping the insulating layer from moving into a mounting region in which the electronic devices are mounted.

18. The semiconductor package of claim 17, wherein the second substrate has electrode pads electrically connected to the first substrate and formed on the top surface thereof and has external connection terminals for being electrically connected to the outside and formed on the bottom surface thereof.

* * * * *